United States Patent
Chen et al.

(10) Patent No.: US 11,926,901 B2
(45) Date of Patent: Mar. 12, 2024

(54) FABRICATION AND STRUCTURE OF A NONENZYMATIC GLUCOSE SENSOR

(71) Applicant: National Yunlin University of Science and Technology, Douliu (TW)

(72) Inventors: Hsi-Chao Chen, Douliu (TW); Wei-Rong Su, Douliu (TW); Yun-Cheng Yeh, Douliu (TW); Chun-Hao Chang, Douliu (TW)

(73) Assignee: NATIONAL YUNLIN UNIVERSITY OF SCIENCE AND TECHNOLOGY, Douliu (TW)

( * ) Notice: Subject to any disclaimer, the term of this patent is extended or adjusted under 35 U.S.C. 154(b) by 1099 days.

(21) Appl. No.: 16/739,135

(22) Filed: Jan. 10, 2020

(65) Prior Publication Data
US 2020/0318241 A1 Oct. 8, 2020

(30) Foreign Application Priority Data
Apr. 2, 2019 (TW) ................. 108111700

(51) Int. Cl.
| | | |
|---|---|---|
| *C25D 9/04* | (2006.01) | |
| *C23C 14/08* | (2006.01) | |
| *C23C 16/26* | (2006.01) | |
| *C23C 28/04* | (2006.01) | |
| *C30B 7/10* | (2006.01) | |
| *C30B 29/16* | (2006.01) | |
| *G01N 27/327* | (2006.01) | |

(52) U.S. Cl.
CPC .......... *C23C 28/042* (2013.01); *C23C 14/086* (2013.01); *C23C 16/26* (2013.01); *C25D 9/04* (2013.01); *C30B 7/10* (2013.01); *C30B 29/16* (2013.01); *G01N 27/3275* (2013.01)

(58) Field of Classification Search
None
See application file for complete search history.

(56) References Cited

PUBLICATIONS

Elahi et al. "A glucose biosensor based on glucose oxidase immobilized on ZnO/Cu2O graphene oxide nanocomposite electrode", JES, 161, 5, B81-B87, 2014 (Year: 2014).*

(Continued)

*Primary Examiner* — Stefanie S Wittenberg
(74) *Attorney, Agent, or Firm* — Leong C. Lei

(57) ABSTRACT

A method for fabricating nonenzymatic glucose sensor, which comprises steps of: (a) providing a bottom substrate; (b) preparing a graphene layer on the bottom substrate; (c) depositing plural amount of zinc oxide (ZnO) seed crystals on the graphene layer; (d) growing the ZnO seed crystals into columnar nanorods with hydrothermal method; (e) coating a thin film of cuprous oxide ($Cu_2O$) on the surface of the ZnO nanorods by electrochemistry-based electrodeposition; and (f) grafting single-walled carbon nanotubes (SWCNTs) on surface of the $Cu_2O$ thin film, by using Nafion fixative composited with SWCNTs. The structure of the above sensor, therefore, comprises a bottom substrate and other components orderly assembled on it, including, from inside to outside, a graphene layer, plural amount of ZnO nanorods, a $Cu_2O$ thin film, plural amount of SWCNTs, and the Nafion fixative. Accordingly, the sensor has advantages of low cost, rapid response, and easy for preservation.

6 Claims, 6 Drawing Sheets

(56) References Cited

PUBLICATIONS

Ahmad et al. "Highly efficient non-enzymatic glucose sensor based on CuO modified vertically-grown ZnO nanorods on electrode", Scientific reports, 7, 5715, 2017 (Year: 2017).*

Mazaheri et al. "Three-dimensional hybrid graphene/nickel electrodes on zinc oxide nanorod arrays as non-enzymatic glucose biosensor", Sensors and Actuators B, 215, 462-471, 2017 (Year: 2017).*

Bao et al. "A non-enzymatic glucose sensor based on copper oxide nanowires-single wall carbon nanotubes" JES, 162, B47, 2015 (Year: 2015).*

* cited by examiner

FABRICATION AND STRUCTURE OF A NONENZYMATIC GLUCOSE SENSOR

(a) TECHNICAL FIELD OF THE INVENTION

The present invention generally relates to the field of glucose biosensor, in particular to the fabrication and the structure a nonenzymatic glucose sensor with superior advantages of low cost, rapid response, and easy for preservation.

(b) DESCRIPTION OF THE PRIOR ART

'Glucose sensor' is one of the most commonly applied biosensors used by human beings, mainly used for measuring the glucose concentration of human blood for the diagnosis of diabetes. The paper chips, which are used with the commercialized glucose-sensing device for glucose detection, are one example of the application of the glucose biosensor. In these well-known and commonly used glucose biosensors, enzymes able to specifically react with glucose and useful for enhancing the sensitivity of its detection are frequently supplemented, in order to strengthen the biosensor's capability for glucose detection. However, these enzymes are generally expensive and are relatively hard for preservation, leading to drawbacks like high cost and short storage life of these paper chip-based biosensors.

In view of the aforementioned drawbacks of the prior art, the inventor of the present invention conduct extensive researches to study, modify and test with prototypes, and finally developed the nonenzymatic glucose sensor provided by the present invention.

SUMMARY OF THE INVENTION

The primary objective of the present invention is to solve the problems associated with the conventional enzyme-based glucose sensor, saying, its high cost and hard for preservation due to the incorporation of enzymes for glucose detection.

To achieve the above objective, the present invention provides a method for fabricating a nonenzymatic glucose sensor, and the method comprises the steps of: (a) providing a bottom substrate; (b) preparing a graphene layer on the bottom substrate; (c) depositing plural amount of zinc oxide (ZnO) seed crystals on the graphene layer; (d) growing the ZnO seed crystals into columnar nanorods via hydrothermal method; (e) coating a thin film of cuprous oxide ($Cu_2O$) on surface of the ZnO nanorods by electrodeposition based on electrochemical method; and (f) grafting single-walled carbon nanotubes (SWCNTs) on surface of the $Cu_2O$ thin-film, by using Nafion as fixative agents, which has been composited with the SWCNTs.

The structure of the nonenzymatic glucose sensor described in the present invention, as fabricated with the aforementioned method, comprises: a bottom substrate, a graphene layer, plural amount of ZnO nanorods, a thin film of $Cu_2O$, plural amount of SWCNTs, and the Nafion fixatives. Wherein, said graphene layer is overlaid on one side of the bottom substrate; said ZnO nanorods are grown on top of the graphene layer and with columnar shape; said $Cu_2O$ thin film is electrodeposited on surfaces of the ZnO nanorods; said SWCNTs are located on surface of the $Cu_2O$ thin-film; said Nafion fixatives are coated on the external parts of the ZnO nanorods. As the Nafion fixatives have been composited with the SWCNTs, they provide supporting linkages to immobilize the SWCNTs on the surface of the $Cu_2O$ thin-film, and, through which, the SWCNTs are grafted onto the surface of the $Cu_2O$ thin-film.

A method for fabricating a nonenzymatic glucose sensor and the structure of the sensor are provided by the present invention. Said sensor is fabricated by using a bottom substrate, on which a series of components are assembled on its top and in defined order, including a graphene layer, plural amount of ZnO nanorods, a thin film of $Cu_2O$, and plural amount of SWCNTs that are immobilized via Nafion, the fixative agent. Wherein, the presence of plural amount of ZnO nanorods will extend the surface area available for active reaction; the $Cu_2O$ thin film incorporated is used as a strong catalyst to trigger vigorous electrolysis of glucose molecule, a responsive reaction required for sensing glucose and its detection. As for the presence of plural amount of SWCNTs, being immobilized via the Nafion fixative and, therefore, being grafted on surface of the $Cu_2O$ thin-film, will provide not only further increase of surface area for active reaction, but also pathways to channel more glucose to penetrate into the interior of the sensor where the aforementioned responsive electrolytic reactions required for glucose detection take place. As a consequence, the capability for trapping glucose of the sensor will be increased, leading to significantly enhanced sensitivity for detecting glucose by the sensor.

Moreover, in comparison with the conventional enzymatic glucose biosensors, the costs required for both of the raw materials and the manufacturing processing for the nonenzymatic glucose sensor described herein are relatively lower, while the sensors obtained are easier in preservation and have longer storage life.

In light of the foregoing, the nonenzymatic glucose sensor provided by the present invention, thus, have superior advantages such as low manufacturing cost, rapid response for glucose detection, easy for preservation and for long term storage.

The above objective and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

Figure 1:
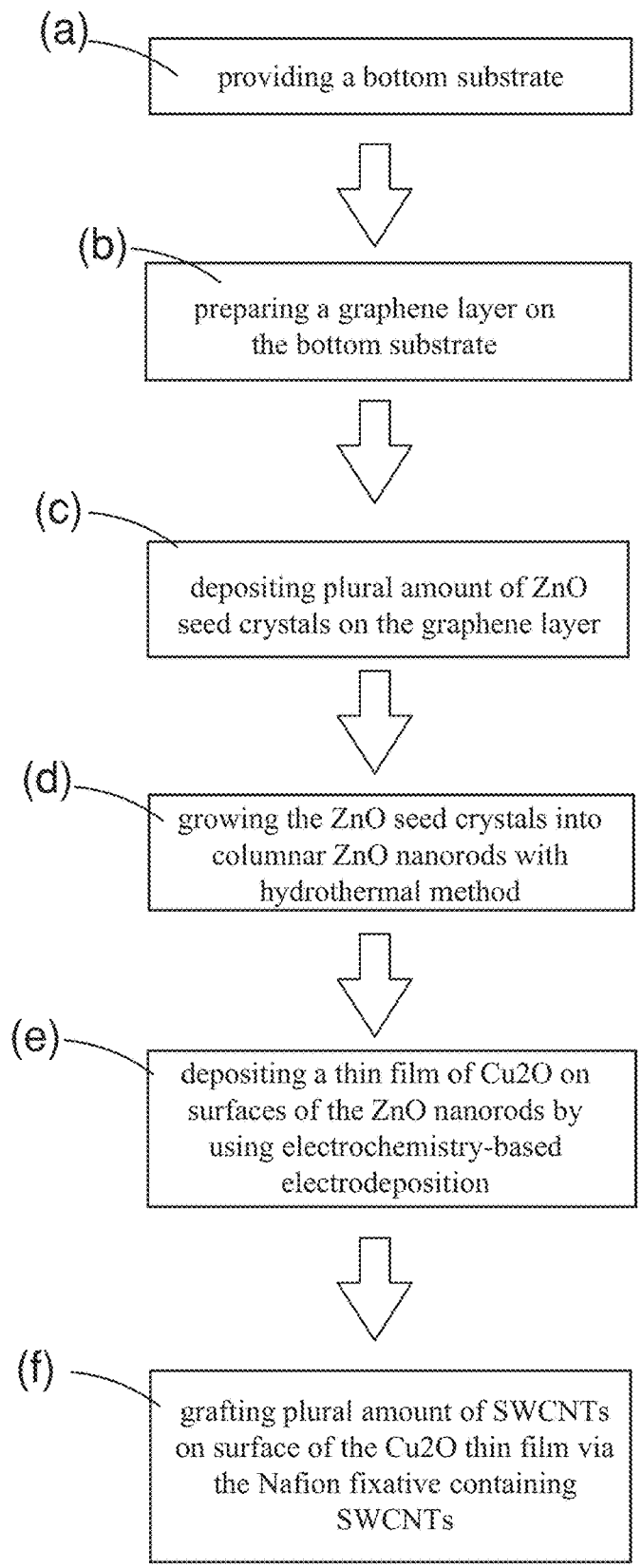
FIG. 1 is a flow chart showing the processes for fabricating the nonenzymatic glucose sensor of the present invention.

The above and other objects, features and advantages of this disclosure will become apparent from the following detailed description taken with the accompanying drawings. It is noteworthy that same numerals are used for the same respective elements in the drawing.

Figure 2:
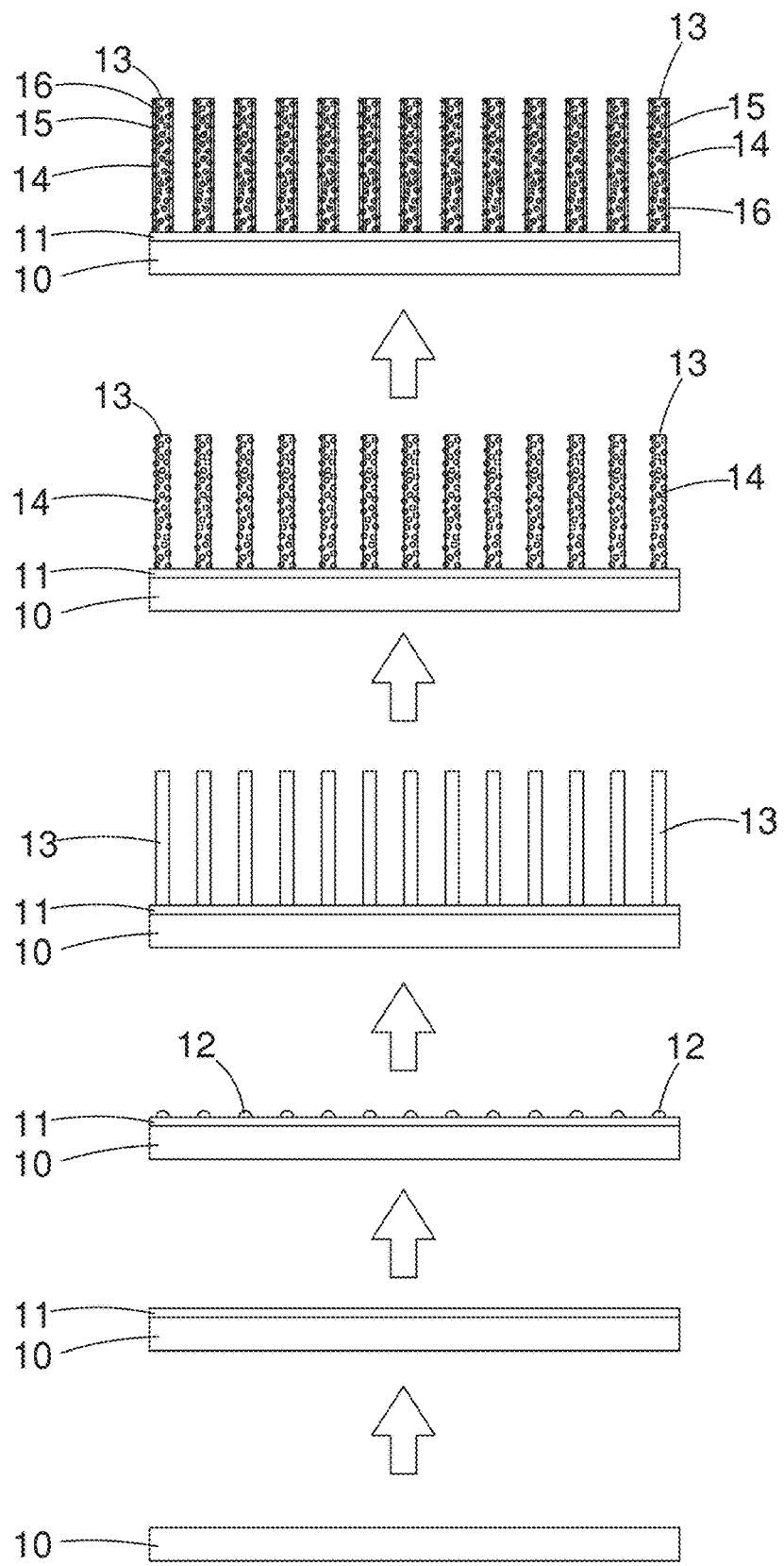
FIG. 2 is a schematic view demonstrating the processes for fabricating the nonenzymatic glucose sensor of the present invention.
Figure 3:
FIG. 3 is an enlarged image of the ZnO nanorods of the present invention, which is prepared with scanning electron microscope (SEM).
Figure 4:
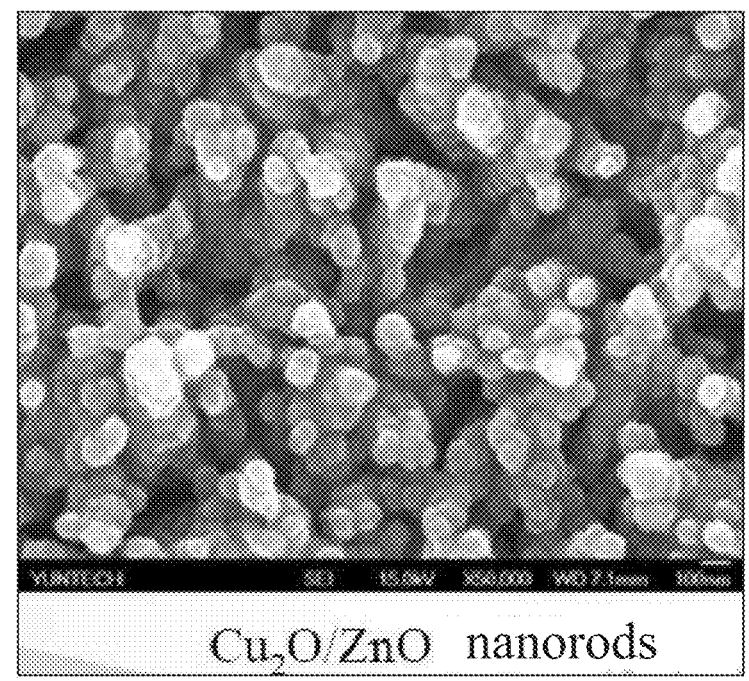
FIG. 4 is an enlarged SEM image of the $Cu_2O$/ZnO nanorod composites of the present invention.

With reference to FIG. 1 and FIG. 2, a method for fabricating a nonenzymatic glucose sensor is provided by the present invention, and the method comprises steps of:

(a) Providing a bottom substrate 10: the bottom substrate 10 can be a plastic sheet (e.g., PET sheet) or a glass slide coated with indium tin oxide (ITO) (i.e., an ITO glass slide);

(b) Preparing a graphene layer 11 on said bottom substrate 10: the graphene layer 11 can be firstly deposited on a copper foil as a thin layer, by using chemical vapor deposition (CVD) method, and then transferred onto the bottom substrate 10 by transferring method;

(c) Depositing plural amount of ZnO seed crystals 12 on said graphene layer 11: with the use of RF magnetron sputter, plural amount of the ZnO seed crystals 12 are deposited on the graphene layer 11, followed with thermal annealing processing at a temperature of 350 Celsius degrees for one hour, so that sufficient energies can be trapped by particles inside the material, and are used to activate the particles for recrystallization; and, through which, defects of lattices and the internal stress appeared in the material is eliminated, resulting in a smoother surface of the material;

(d) Growing the ZnO nanorods 13 with hydrothermal method: a precursor solution at a concentration of 12.5 mM is prepared with zinc nitrate $(Zn(NO_3)_2)$ and hexamethylenetetramine $(C_6H_{12}N_4)$, in a molar ratio of 1:1; the aforementioned bottom substrate 10, which contains the graphene layer 11 and the ZnO seed crystals 12, is immersed into the precursor solution; and then, with the use of hydrothermal method, to have the ZnO seed crystals 12 grown into the ZnO nanorods 13 (please refer to the image shown in FIG. 3);

(e) Coating a thin film of $Cu_2O$ 14 on the surfaces of the ZnO nanorods 13 by using electrochemistry-based electrodeposition: the aforementioned bottom substrate 10 containing the composite of the graphene layer 11 and the ZnO nanorods 13 is proceeded to coat a thin film of $Cu_2O$ 14 on the surfaces of the ZnO nanorods 13, with the use of a precursor solution and via electrodeposition based on electrochemical method (please refer to the image shown in FIG. 4); and (f) Grafting the SWCNTs 15 on surface of the $Cu_2O$ thin film 14 by using the Nafion fixative 16 containing the SWCNTs 15: a 10 mL of solution containing 0.5% (by weight) of the Nafion fixative 16 is prepared firstly by mixing 1 mL of Nafion and 9 mL of deionized pure water; then, 10 mg of the SWCNTs 15 are added into the above solution of the Nafion fixative 16, followed with treatment of ultrasound sonication for one hour to thoroughly disperse the SWCNTs 15 in the solution of the Nafion fixative 16; the solution of the Nafion 16 containing SWCNTs are then overlaid, drop-by-drop, onto the aforementioned bottom substrate 10 containing composites of the graphene layer 11, the ZnO nanorods 13 and the $Cu_2O$ thin film, through which, the SWCNTs 15 are grafted on the surface of the $Cu_2O$ thin film 14. The nonenzymatic glucose sensor is then completely prepared.

Figure 5:
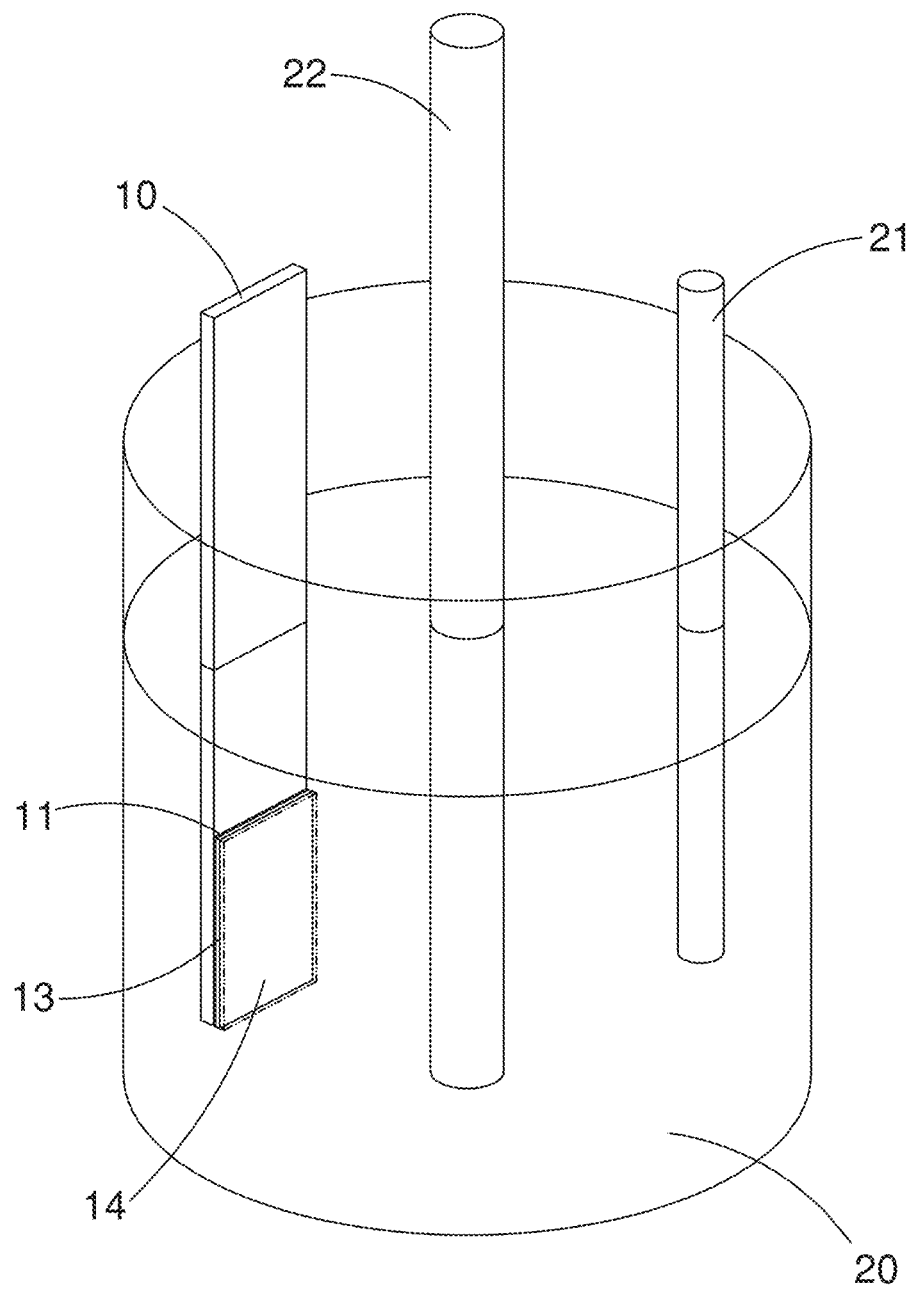
FIG. 5 is a schematic view showing the electrochemistry-based method for electrodepositing a $Cu_2O$ thin film on surfaces of ZnO nanorods of the present invention.

With the reference to FIG. 5, the electrochemistry-based electrodeposition of step (e) is proceeded as following: mixing 16.2 g of 85% lactic acid $(C_3H_6O_3)$, 3 g of hydrated copper sulfate $(Cu_2SO_4·5H_2O)$ and 46.5 mL of deionized water to make up a solution with an amount of 60 mL, in which the molar ratio of lactic acid and copper sulfate is 3:0.2; adding sodium hydroxide (NaOH) to the above solution slowly, until the solution pH reaches to a value of 9; keeping the solution standing still for a period of time to cool down the solution temperature slowly, which is increased due to the thermal energy released from the neutralization of acids and alkali appeared in the solution; when these reactions have been completed thoroughly, the preparation of the precursor solution 20 will be done; after that, the bottom substrate 10, which has been prepared in the step (d) and contains the composites of the graphene layer 11 and the ZnO nanorods 13, is immersed into the precursor solution 20 as a working electrode, along with the use of a platinum (Pt) 21 as counter electrode and a silver chloride (Ag/AgCl₂) 22 as reference electrode; this precursor 20 is then heated to a temperature of 50 Celsius degrees on a hot plate and is used as electrolytes for the electrochemistry-based electrodeposition. Based on method of chronoamperomety and by applying the working electrode with an electric pressure of −0.6 V (vs Ag/AgCl), particles of $Cu_2O$ will then be electrodeposited on surface of the working electrode, resulting in the formation of the aforementioned $Cu_2O$ thin film 14 on the surface of the ZnO nanorods.

Figure 6:
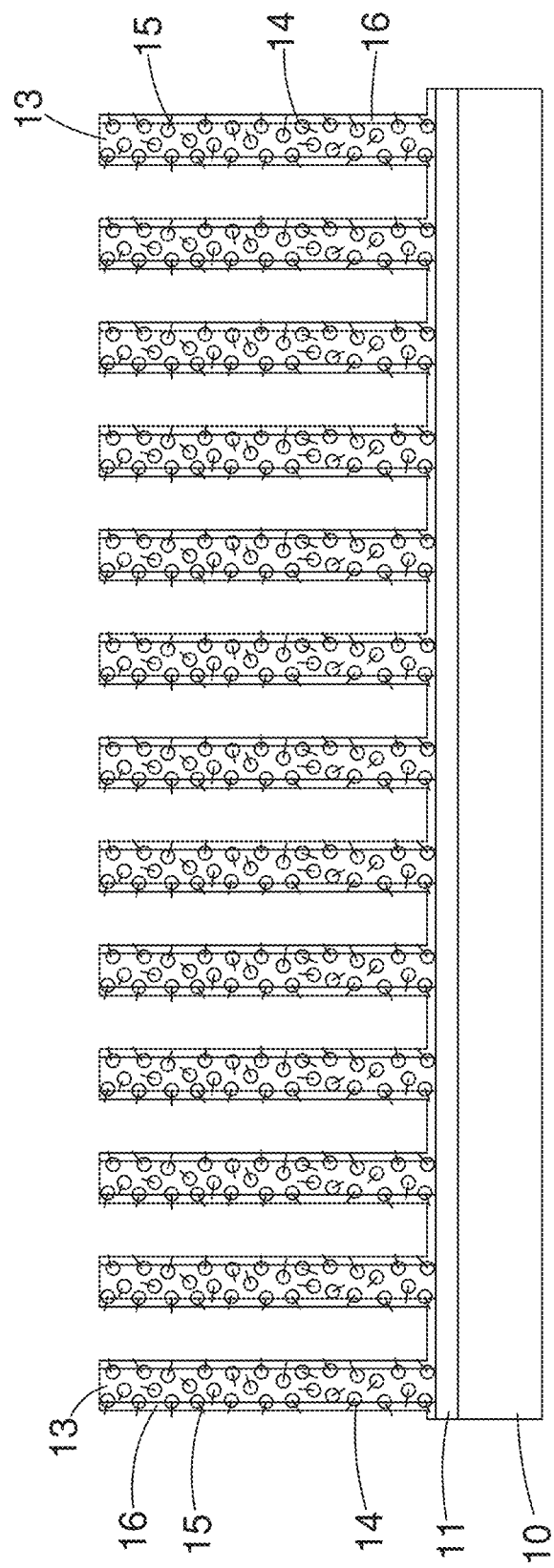
FIG. 6 is a schematic view showing the structure of sensor of the present invention.

With reference to FIG. 6, a schematic view is shown to demonstrate the structure of the nonenzymatic glucose sensor of the present invention, which comprises: a bottom substrate 10, a graphene layer 11, plural amount of ZnO nanorods 13, a $Cu_2O$ thin film 14, plural amount of SWCNTs 15, and the Nafion fixative 16. Wherein:

said bottom substrate 10 is a plastic sheet (e.g., PET sheet) or an ITO glass slide;

said graphene layer 11 is overlaid on one side of the bottom substrate 10;

said plural amount of ZnO nanorods 13 are grown from the graphene layer 11 and with columnar shape;

said $Cu_2O$ thin film 14 is electrodeposited on surfaces of the ZnO nanorods 13;

said plural amount of SWCNTs 15 are located on surface the $Cu_2O$ thin film 14;

said Nafion fixatives 16 are overlaid on the external part of the ZnO nanorods 13, for supporting linkage to immobilize the plural amount of SWCNTs 15 on the $Cu_2O$ thin film 14, through which, the plural amount of SWCNTs 15 are then grafted on surfaces of the $Cu_2O$ thin film 14.

Figure 7:
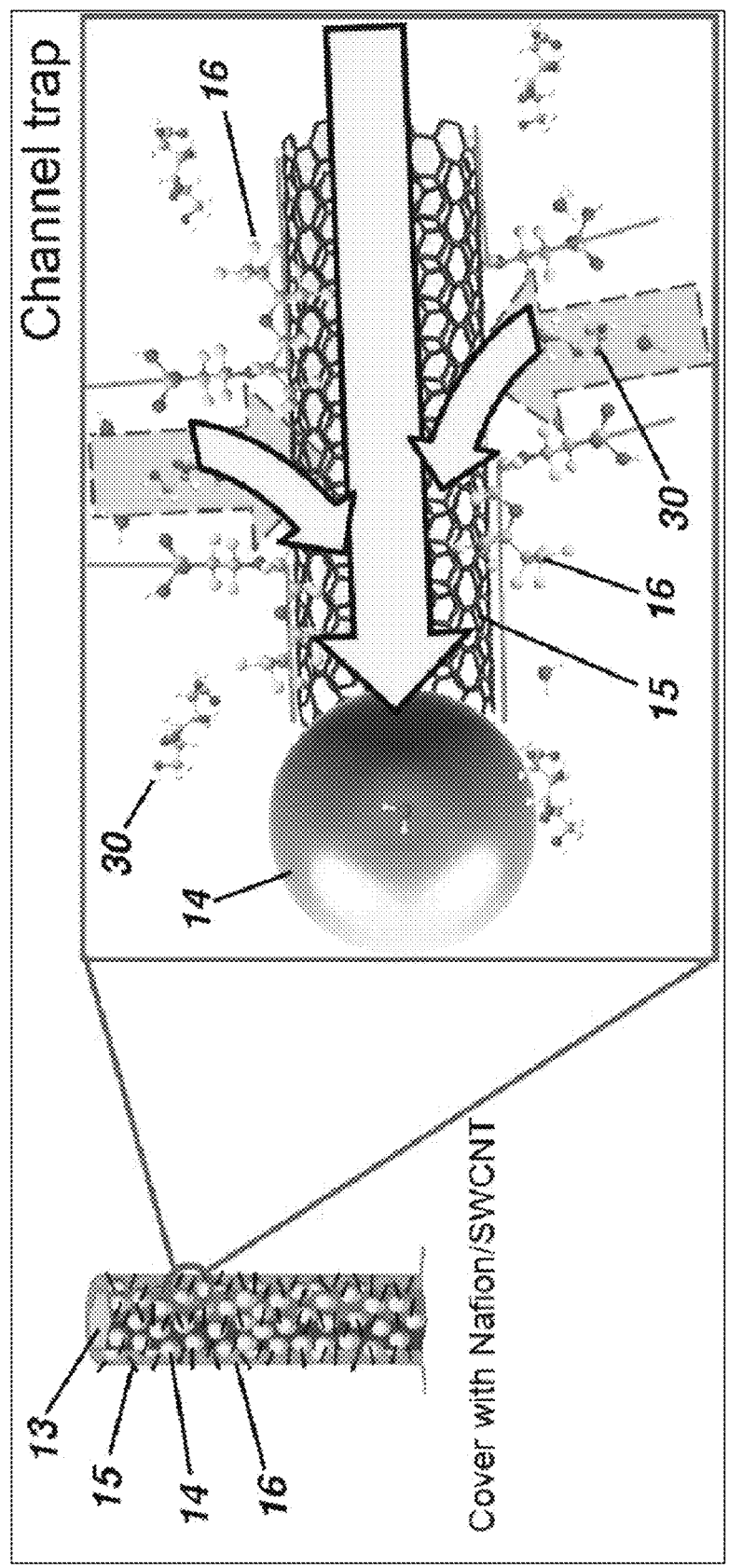
FIG. 7 is a schematic view showing the structural components and configuration on surface of the ZnO nanorod of the present invention, with an enlarged drawing to demonstrate the reactive movement of glucose molecules on surface of the SWCNT (single-walled carbon nanotube).

With reference to FIG. 7, a schematic view is shown to demonstrate the structural components and their configuration on the surface of the ZnO nanorod. After the coating of the Nafion fixatives 16, which contains the SWCNTs 15, on the ZnO nanorods 13, it will modify the surface of the sensor with some chemical polarity for bonding. Such modification is not only able to have the SWCNTs 15 to further separate with each other, but also to provide compatible channels for molecules of the glucose 30 to penetrate into the interior of the sensor where it can be actively detected, leading to the increase of the sensor's capability of trapping glucose 30 and, further, resulted in greatly enhanced sensitivity for its detection by the sensor.

The method for fabricating a nonenzymatic glucose sensor and structure of the sensor are provided by the present invention, and said sensor is fabricated by using a bottom substrate 10, on which a series of components are assembled on its top and in defined order, including a graphene layer 11, plural amount of ZnO nanorods 13, a $Cu_2O$ thin film 14, plural amount of SWCNTs 15 and the Nafion fixatives 16. Wherein, the ZnO nanorods 13 will extend the surface area available for active reaction; the $Cu_2O$ thin film 14 is used as a strong catalyst to trigger vigorous electrolysis of glucose molecule, a responsive reaction required for sensing glucose and its detection; the SWCNTs 15, being immobilized via the Nafion fixative 16 and, therefore, being grafted on surface of the $Cu_2O$ thin film 14, will provide not only further increase of surface area for active reaction, but also pathways to channel more glucose to penetrate into the interior of the sensor where the aforementioned responsive electrolytic reactions required for glucose detection take place. As a consequence, the capability for trapping glucose of the sensor will be increased, leading to significantly enhanced sensitivity for detecting glucose by the sensor. Moreover, in comparison with the conventional enzymatic glucose biosensors, the costs required for the raw materials of manufacturing the nonenzymatic glucose sensor described herein are relatively lowered, while the sensors obtained are easier for preservation and have longer storage life. Accordingly, the aforementioned nonenzymatic glucose sensor is advantageous with low cost, rapid response and easy for preservation.

In light of the foregoing, the nonenzymatic glucose sensor provided by the present invention has the aforementioned advantages and is useful for practical utilization such as measuring the glucose concentration of human blood for the diagnosis of diabetes. Beside, no product of the like for glucose detection is publicly disclosed. Based on the novelty, improved properties and useful for practical utilization that the aforementioned nonenzymatic glucose sensor possesses, it fulfills the requirement for patent protection and is then submitted for the purpose.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

We claim:
1. A method for fabricating a nonenzymatic glucose sensor, comprising the following steps of:
   (a) providing a bottom substrate;
   (b) preparing a graphene layer on the bottom substrate;
   (c) depositing a plural amount of zinc oxide (ZnO) seed crystals on the graphene layer;
   (d) growing the ZnO seed crystals into columnar ZnO nanorods with a hydrothermal method;
   (e) depositing a thin film of cuprous oxide ($Cu_2O$) on surface of the ZnO nanorods via an electrodeposition method; and
   (f) grafting single-walled carbon nanotubes (SWCNTs) on a surface of the thin-film of $Cu_2O$, by using Nafion fixative composited with SWCNTs.

2. The method of claim 1 for fabricating a nonenzymatic glucose sensor, wherein in the step (b), the graphene layer is firstly deposited on a copper foil by using a chemical vapor deposition (CVD) method, and then transferred onto said bottom substrate by a transferring method.

3. The method of claim 1 for fabricating a nonenzymatic glucose sensor, wherein in the step (c), with the use of a RF magnetron sputter, the plural amount of the ZnO seed crystals are deposited on the graphene layer, followed with a thermal annealing processing at a temperature of 350 degrees Celsius for one hour, so that sufficient thermal energy can be trapped by particles inside the ZnO seed crystals for activating the particles to be recrystallized; and through which, the defects of lattices and the internal stress in the crystals is eliminated, making their surfaces smoother.

4. The method of claim 1 for fabricating a nonenzymatic glucose sensor, wherein in the step (d), a precursor solution at a concentration of 12.5 mM is prepared with zinc nitrate ($Zn(NO_3)_2$) and hexamethylenetetramine ($C_6H_{12}N_4$), in a molar ratio of 1:1; the bottom substrate containing the graphene layer and the ZnO seed crystals, is then immersed into the precursor solution prepared in the step (d), where the ZnO seed crystals grow into the ZnO nanorods via the hydrothermal method.

5. The method of claim 1 for fabricating a nonenzymatic glucose sensor, wherein, in the step (e), the electrodeposition method is proceeded as follows: mixing 16.2 g of 85% lactic acid ($C_3H_6O_3$), 3 g of hydrated copper sulfate ($Cu_2SO_4 \cdot 5H_2O$) and 46.5 mL of deionized water to make up a solution with an amount of 60 mL, in which the molar ratio of lactic acid and hydrated copper sulfate is 3:0.2; adding sodium hydroxide (NaOH) to the solution slowly, until the solution pH reaches to 9;

keeping the solution standing still for a period of time to slowly cool down the solution temperature which increases due to the thermal energy released from neutralizing the acids with an alkali during the preparation of the solution; a second precursor solution is formed when the neutralization process is completed thoroughly; the bottom surface, being processed in the step (d) and comprises the graphene layer and the ZnO nanorods, is then immersed into the second precursor solution to be a working electrode, a counter electrode made of platinum (Pt) and a reference electrode made of silver chloride (Ag/AgCl) are immersed into the second precursor solution; the second precursor solution is then heated to a temperature of 50 degrees Celsius on a hot plate to be used as an electrolyte for the electrodeposition, during which, particles of $Cu_2O$ will be electrodeposited on the surface of the working electrode, resulting in the formation of a thin film of $Cu_2O$; the electric potential applied on the working electrode is −0.6 V (vs Ag/AgCl).

6. The method of claim 1 for fabricating a nonenzymatic glucose sensor, wherein, in the step (f), a 10 mL of solution containing 0.5% (by weight) of the Nafion fixative is prepared firstly by mixing 1 mL of Nafion fixative and 9 mL of deionized pure water; then, 10 mg of the SWCNTs are added into the Nafion fixative-containing solution, followed with a treatment of ultrasound sonication for one hour to thoroughly disperse the SWCNTs in the Nafion fixative-containing solution;

the solution containing the Nafion fixative and SWCNTs, is then overlaid, in a drop-by-drop manner, onto the bottom substrate completed in step (e), which comprises the graphene layer, the ZnO nanorods and the thin film of $Cu_2O$; thereby grafting the SWCNTs on the surface of the thin film of $Cu_2O$.

* * * * *